United States Patent
Yonge, III et al.

(10) Patent No.: US 6,278,685 B1
(45) Date of Patent: Aug. 21, 2001

(54) ROBUST TRANSMISSION MODE

(75) Inventors: Lawrence W. Yonge, III, Ocala; Bart W. Blanchard, Ft. McCoy; Harper Brent Mashburn, Gainesville, all of FL (US)

(73) Assignee: Intellon Corporation, Ocala, FL (US)

( * ) Notice: Subject to any disclaimer, the term of this patent is extended or adjusted under 35 U.S.C. 154(b) by 0 days.

(21) Appl. No.: 09/377,131

(22) Filed: Aug. 19, 1999

(51) Int. Cl.[7] .............................. H04J 11/00; H04L 1/00
(52) U.S. Cl. .................... 370/203; 370/208; 375/346; 375/348; 714/746
(58) Field of Search ........................... 370/203–206, 370/207–208, 252; 714/746, 752, 786–788; 375/260, 265, 267, 375, 295, 303, 308, 254, 346, 348, 298

(56) References Cited

U.S. PATENT DOCUMENTS

| | | | |
|---|---|---|---|
| 4,881,241 | 11/1989 | Pommier et al. | 375/38 |
| 5,197,061 | 3/1993 | Halbert-Lassalle et al. | 370/11 |
| 5,228,025 | 7/1993 | Le Floch et al. | 370/20 |
| 5,274,629 | 12/1993 | Helard et al. | 370/50 |
| 5,307,376 | 4/1994 | Castelain et al. | 375/38 |
| 5,416,801 | 5/1995 | Chouly et al. | 375/260 |
| 5,452,288 | 9/1995 | Rahuel et al. | 370/19 |
| 5,452,322 | 9/1995 | Lauer | 375/330 |
| 5,483,529 | 1/1996 | Baggen et al. | 370/70 |
| 5,488,632 | 1/1996 | Mason et al. | 375/260 |
| 5,524,027 | 6/1996 | Huisken | 375/341 |
| 5,610,908 | 3/1997 | Shelswell | 370/210 |
| 5,694,389 | 12/1997 | Seki et al. | 370/208 |
| 5,732,113 | * 3/1998 | Schmidl et al. | 375/355 |
| 5,757,766 | 5/1998 | Sugita | 370/206 |
| 5,799,033 | 8/1998 | Baggen | 375/200 |
| 5,812,599 | 9/1998 | Van Kerckhove | 375/260 |
| 5,903,614 | 5/1999 | Suzuki et al. | 375/340 |
| 5,914,932 | 6/1999 | Suzuki et al. | 370/203 |
| 5,966,412 | 10/1999 | Ramaswamy | 375/341 |
| 6,125,150 | * 9/2000 | Wesel et al. | 375/265 |
| 6,151,296 | 11/2000 | Vijayan et al. | 370/208 |
| 6,192,068 | * 2/2001 | Fattouche et al. | 375/200 |

* cited by examiner

Primary Examiner—Wellington Chin
Assistant Examiner—Maikhanh Tran
(74) Attorney, Agent, or Firm—Fish & Richardson P.C.

(57) ABSTRACT

An interleaving/de-interleaving scheme for providing redundancy with both time and frequency diversity to data in OFDM symbols in a data transmission system. On the transmit side, encoded data to be modulated onto carriers in OFDM symbols is interleaved by storing the encoded data in an interleaver memory and reading multiple copies of the encoded data from the interleaver memory so that the encoded data copies are spread in time on non-consecutive symbols and in frequency on non-adjacent carriers. On the receive side, the multiple copies of the OFDM data are received, and phase noise computations are used to combine the multiple copies (in either metric or phase angle form) into one. From the combined copies a single metric value to be used in decoding the OFDM data is produced.

19 Claims, 12 Drawing Sheets

| INPUT VALUE RANGE | SOFT DECISION VALUE | INPUT VALUE RANGE | SOFT DECISION VALUE |
|---|---|---|---|
| $51 \geq P_K \geq 49$ | 4 | $115 \geq P_K \geq 113$ | 3 |
| $54 \geq P_K \geq 52$ | 5 | $118 \geq P_K \geq 116$ | 2 |
| $62 \geq P_K \geq 55$ | 6 | $126 \geq P_K \geq 119$ | 1 |
| $97 \geq P_K \geq 63$ | 7 | $P_K \geq 127$ OR $33 \geq P_K$ | 0 |
| $105 \geq P_K \geq 98$ | 6 | $41 \geq P_K \geq 34$ | 1 |
| $108 \geq P_K \geq 106$ | 5 | $44 \geq P_K \geq 42$ | 2 |
| $112 \geq P_K \geq 109$ | 4 | $48 \geq P_K \geq 45$ | 3 |

FIG. 5

X = EXPECTED DIFFERENTIAL PHASE LOCATION

|  | | PNc | | |
|---|---|---|---|---|
|  | | $C_2$ | $C_1$ | |
|  | | 1X | 01 | 00 |
| | 1X | 1 | 3/4 | 1/2 |
| $S_2$ | | | | |
| PNs  01 | | 3/4 | 1/2 | 1/4 |
| $S_1$ | | | | |
| | 00 | 1/2 | 1/4 | 1/8 |

FIG. 10

| INITIAL SOFT METRIC | | APPLY WEIGHTS 1, 3/4, 1/2, 1/4, 1/8 | | | | | |
|---|---|---|---|---|---|---|---|
| 7 | +7 | +7.000 | | +28.000 | | +14 | +18 | 7 |
| 6 | +5 | . | . | . | . | . | . | 6 |
| 5 | +3 | . | . | . | . | . | . | 5 |
| 4 | +1 ⟹ X2-7 | ⟹ | ⟹ ±1 Σ⁴ | . | ⟹ FLOOR 1/2 | . | . | 4 |
| 3 | -1 | . | | . | | . | +4 ⟹ | 3 ⟹ LIMIT |
| 2 | -3 | . | | . | | . | . | 2 |
| 1 | -5 | . | | . | | . | . | 1 |
| 0 | -7 | -7.000 | | -28.000 | | -14 | -10 | 0 |
| # BITS 3 | 5 | 8 | | 10 | | 6 | 7 | 3 |
| ROBO_METRIC | ROBO_METRIC_CONV | ROBO_METRIC_WEIGHT | | ROBO_METRIC_SUM | | | ROBO_METRIC_SHIFT | ROBO_METRIC_LIMIT |

FIG. 11

ROBUST TRANSMISSION MODE

BACKGROUND OF THE INVENTION

The invention relates to OFDM data transmission systems.

OFDM is a spread spectrum technology wherein the available transmission channel bandwidth is subdivided into a number of discrete channels or carriers that are overlapping and orthogonal to each other. Data are transmitted in the form of symbols that have a predetermined duration and encompass some number of carrier frequencies. The data transmitted over these OFDM symbol carriers may be encoded and modulated in amplitude and/or phase, using conventional schemes such as Binary Phase Shift Key (BPSK) or Quadrature Phase Shift Key (QPSK).

A well known problem in the art of OFDM data transmission systems is that of impulse noise, which can produce bursts of error on transmission channels, and delay spread, which often causes frequency selective fading. To address these problems, prior systems have utilized forward error correction (FEC) coding in conjunction with interleaving techniques. FEC coding adds parity data that enables one or more errors in a code word to be detected and corrected. Interleaving reorders the code word bits in a block of code word data prior to transmission to achieve time and frequency diversity.

Although the prior interleaving techniques can minimize some of the effects of impulse noise and delay spread on OFDM data transmission, they cannot mitigate the impact of a combination of impulse noise and frequency nulls, which may result in lengthy noise events, on transmitted OFDM data symbols.

SUMMARY OF THE INVENTION

In one aspect of the invention, encoded data to be modulated onto carriers of OFDM symbols in a packet of consecutive OFDM symbols for transmission over a transmission channel is interleaved to produce copies of the encoded data which are spread in time on non-consecutive OFDM symbols in the packet of consecutive OFDM symbols and in frequency on nonadjacent carriers.

In another aspect of the invention, OFDM data received from a transmission channel are processed for a more robust data transmission. Multiple copies of the OFDM data are received from the transmission channel, the multiple copies being spread in time and frequency. Phase angle information for the multiple copies is combined to produce a single metric value to be used in decoding the OFDM data.

Embodiments of the invention may include one or more of the following features.

Interleaving can include storing the encoded data in an interleaver memory by row and reading the encoded data from the interleaver memory by column, the encoded data stored in the interleaver memory being read n consecutive times.

The encoded data reads can include an offset to all but the first of the column reads of each of the n consecutive reads and different additional offsets to all but the first of the n consecutive reads.

The phase angle information can include a metric value for each of the four copies. Alternatively, the phase angle information can include phase angle representation values.

The phase angle representation values for the data copies can be combined in the following manner. Phase noise values are computed from the phase angle representations for the data copies. A weighting is applied to the phase angle representation values based on the computed phase noise values. The weighted phase angle representation values are summed and converted to a single metric value.

If metric value copies are used, then they may be combined in the following manner. Phase angles of the multiple copies are converted to metric values. Phase noise values are computed from the phase angles for the data copies. A weighting is selected and applied to the metric values based on the computed phase noise values and the weighted metric values are summed.

Alternatively, the metric value copies can be combined by summing the metric values to produce a sum and using the sum to compute an average metric value as a single metric value.

In yet another alternative, combining the metric value copies can include selecting one of the metric values.

In either of the combination processes, amplitudes of the copies may be compared to a jammer detection threshold and the results of the comparison used to override the selected weighting so that a minimal weighting is applied to the metric values or phase representation values for the copies.

The technique of the invention offers several advantages. It provides a level of redundancy and combines that level of redundancy with frequency and time diversity. Consequently, because each data bit is evenly distributed across the frequency band in each symbol and across the transmitted symbols in time, there is a greater likelihood of recovering data lost as a result of a noise event or destructive canceling (caused by delay spread), since the best copies of the redundant data can be used. The technique also uses phase noise to weight the copies differently prior to combining the copies into a single copy. Strong carriers with low phase noise are weighted more heavily. Thus, the transmission as a whole is more reliable, even in extremely noisy environments.

Other features and advantages of the invention will be apparent from the following detailed description and from the claims.

BRIEF DESCRIPTION OF THE DRAWINGS

FIG. 5 is a table of soft decision conversion values produced by the demodulator of the receiver shown in FIG. 1.

FIG. 10 is an illustration of a weight table for determining the weighting to be applied to deinterleaver output copies based on the carrier and symbol phase noise average values.

FIG. 11 is an illustration of the bit metrics conversion performed by the controller of FIG. 6.

DETAILED DESCRIPTION

Figure 1:
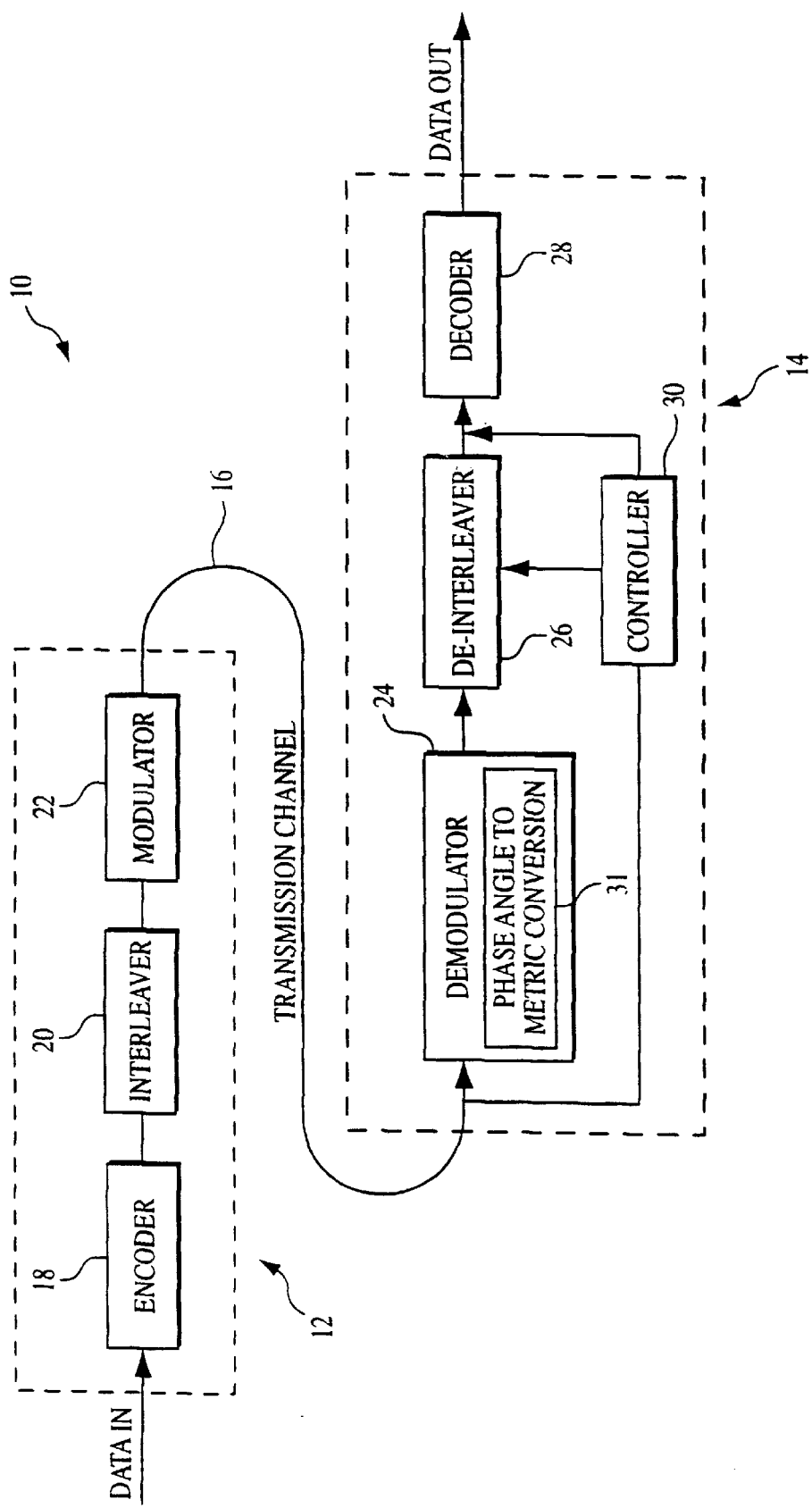
FIG. 1 is a data transmission system having a transmitter for sending data in OFDM symbols and a receiver for receiving data in OFDM symbols.

Referring to FIG. 1, a data transmission system 10 includes a transmitter 12 and a receiver 14 interconnected by a data transmission channel 16. The transmitter 12 includes an encoder 18, an interleaver 20 and a modulator 22. The receiver 14 includes a demodulator 24, a de-interleaver 26, a decoder 28 and a controller 30. During use, data is presented to an input of the encoder 18. The encoder 18 encodes the data in a forward error correction code and writes the encoded data to the interleaver 20. Any known forward error correction code, for example, a convolution code, can be used for this purpose. The modulator 22 reads the encoded data from the interleaver 20 and modulates the encoded data onto carriers in OFDM symbols in accordance with conventional OFDM modulation techniques. Those modulation techniques may be coherent or differential. In the preferred embodiment, the modulation type may be either Binary Phase Shift Keying (BPSK) or Quadrature Phase Shift Keying (QPSK).

The demodulator 24 demodulates the OFDM symbols received from the transmission channel 16 and converts phase angles of the data in each carrier of each symbol to metric values. The phase angle to metric value conversion function is indicated in the figure by reference numeral 31. The demodulator 24 stores the metric values in the deinterleaver 26. The decoder 28 reads the metric values from the deinterleaver 26 and uses the metric values for decoding purposes. The decoder 28 corrects bit errors occurring during transmission from the encoder 18 to the decoder 28. In the described embodiment, the decoder 28 may include a Viterbi decoder and/or Reed-Solomon decoder. The error correction code is such that bit errors which occur distributed uniformly throughout symbols and frequency carriers can be readily corrected. Burst errors, where a number of successive bits in successive symbols or adjacent frequencies are incorrect, can be less readily corrected.

Although the illustrated demodulator performs a conversion to metric values, it could produce phase angle representations and store the phase angle representations in the deinterleaver for later conversion to a metric value, as will be described. A phase angle representation could represent a phase angle in terms of a number of degrees from an expected value (e.g., 0 or 180 degrees). As an example, for BPSK modulated data, a received phase angle ($A_R$) having a value between 0 and $2\pi$ may be represented by a phase angle representation value of $A_R - (\pi/2)$ if $A_R$ is less than or equal to $\pi$, or $2\pi - A_{R-(\pi/2)}$ if $A_R$ is greater than $\pi$. The general phrase "phase angle information" as used herein will refer to either the metric values or the phase angle representation values.

Still referring to FIG. 1, the controller 30 is coupled to the receiver side of the transmission channel 16, the de-interleaver 26 and the output of the de-interleaver 26. The functionality of the controller 30 will be described in detail later with reference to FIG. 6. For purposes of simplification and clarity, details of OFDM transmitter and receiver design which are known to those skilled in the art and not considered pertinent to the understanding of the transmission mode of the invention have been largely omitted herein.

Figure 2:
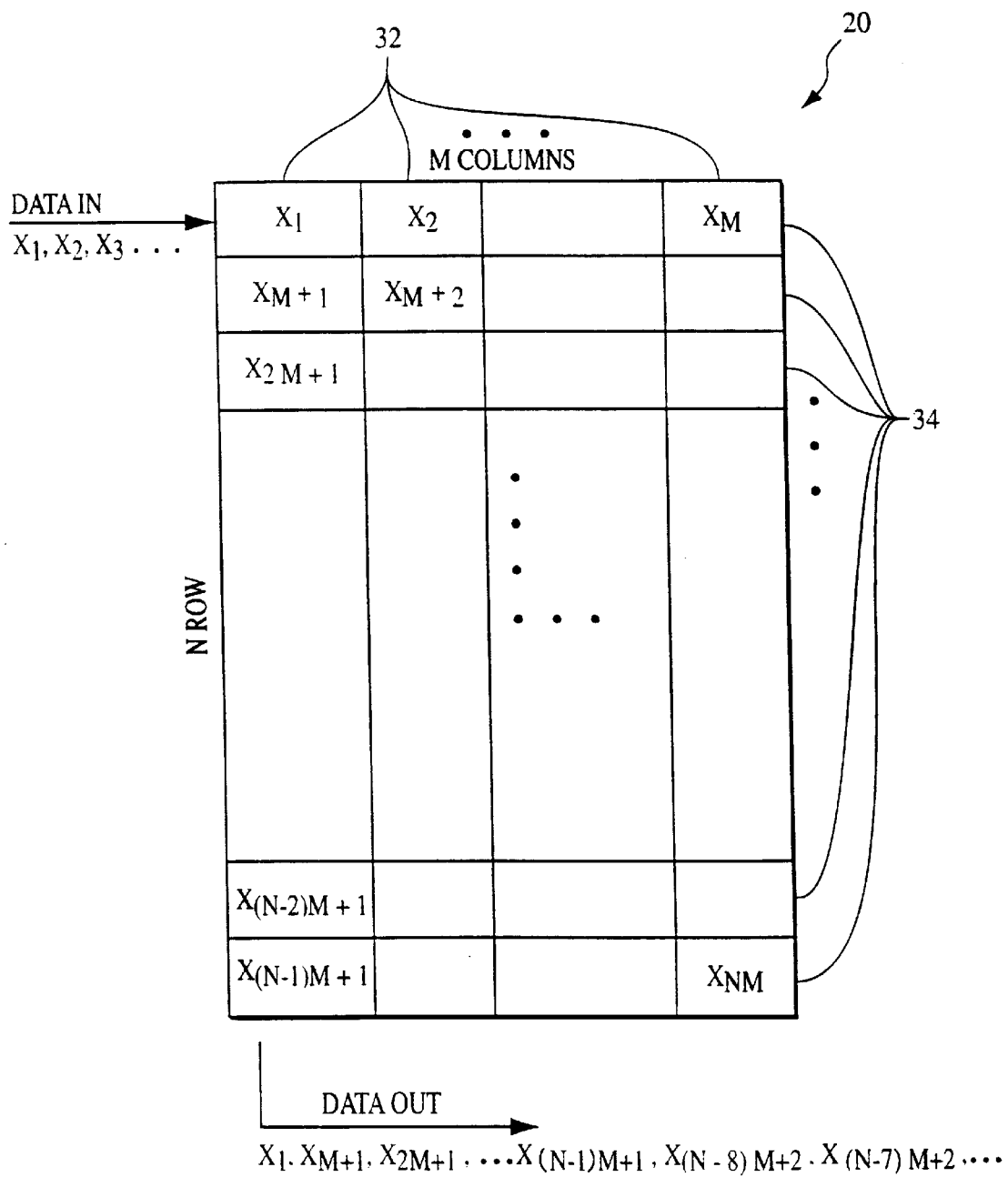
FIG. 2 is an interleaver for storing data in the transmitter of FIG. 1.

Referring to FIG. 2, the interleaver 20 is a row/column interleaver memory of M columns 32 and N rows 34. In the preferred embodiment, M=40 and N=84. Data is stored by row and read by column with some amount of shifting to reorder bits. The row numbers (addresses) J are computed according to $$J = (1 + [(K-1)*p]) \bmod N \quad (1)$$

where K is the column number, p is an offset parameter (indicating the amount by which the column bits are shifted) and N is the total number of rows (or selectable memory locations). As an example, if K=2, p=8, and N=84, the column read for column 2 will begin at row 9.

In the illustrated embodiment, the interleaver 20 is capable of being operated in two different modes: a standard transmission mode and a robust transmission mode. In the standard transmission mode, the interleaver 20 stores 40 OFDM symbols to be transmitted in a single packet or block of data, and is addressed in the following manner. During a write operation, the encoder 18 writes twenty bits of encoded data into consecutive rows starting at row 0. The least significant bit (LSB) of the twenty bit word is first-in-time encoded data. During a read operation, the modulator 22 reads by column starting at row 0, with each successive column read starting with the offset p=8 by adding eight to the previous column's start row. The LSB of the 20-bit word will be first-in-time modulated data. The above technique provides data spreading in both time and frequency, allowing block errors in either domain to be spread far enough apart to allow correction by the decoder 28.

Figure 3:
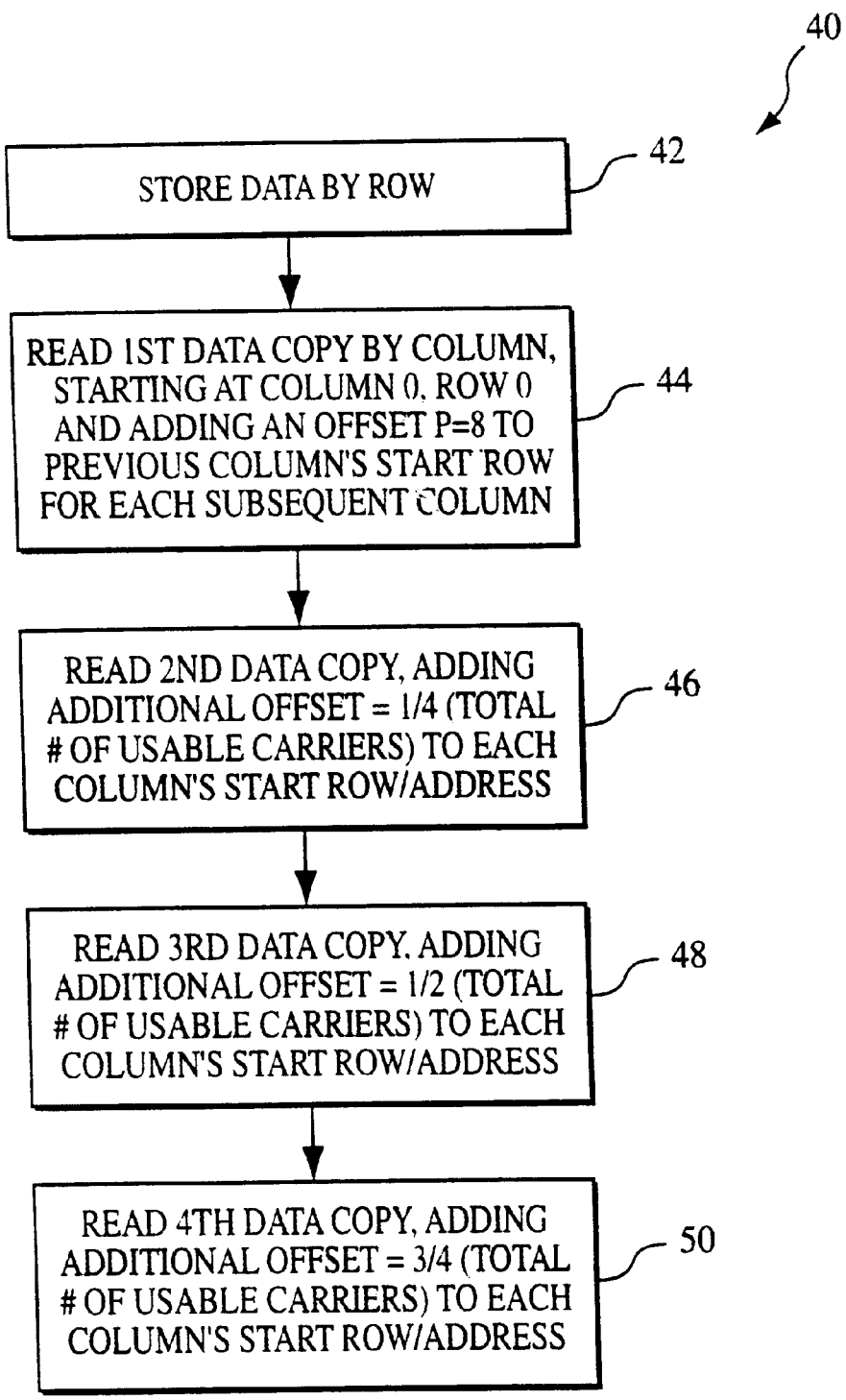
FIG. 3 is a flow diagram of the interleaving process.

In the robust transmission mode, the interleaver 20 uses ten columns (bits 0 to 9) instead of twenty. The number of rows is equal to the number of usable carriers per OFDM symbol. The interleaver 20 stores 10 OFDM symbols instead of 40 and is read four consecutive times to create a 40 symbol packet. During robust mode, and as shown in FIG. 3, an interleaver process 40 of robust mode begins by filling the interleaver 20 in the same manner as during standard transmission mode, that is, it stores the encoded data (FEC code words) by row (step 42). During a read operation, the modulator 22 reads a first copy of the data from the interleaver 20 by columns, with each successive column read adding an offset of eight to the previous column's start row (step 44). The interleaver 20 is read in its entirety four consecutive times. It starts with row 0 on the first pass. The second copy is read starting at a row number equal to (the number of usable carriers)*¼ (step 46). On the third pass, the third copy is read starting at a row number equal to (the number of usable carriers)*½ (step 48). On the fourth (and final) read, the starting row number is equal to (the number of usable carriers)*¾ (step 50).

The interleaver control circuitry for controlling the mechanics of the reads and writes is well-known and therefore omitted from the description. Such control circuitry may be included in the encoder 18 and modulator 22, as is assumed in the illustrated embodiment, in the interleaver 20 itself, or may reside in a separate control unit.

Figure 4:
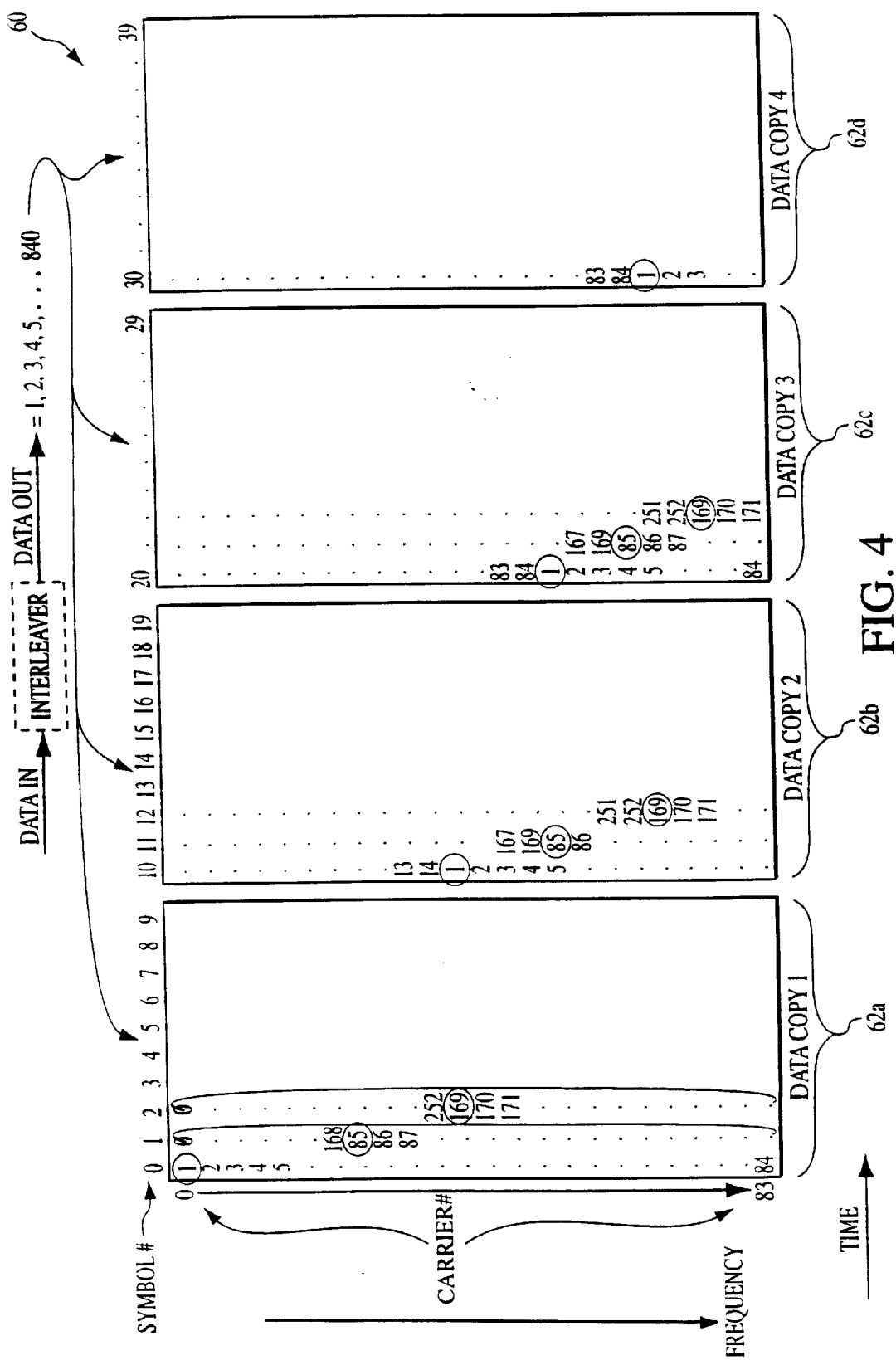
FIG. 4 is an illustration of four consecutive data copies read during the interleaving process of FIG. 3.

Referring to FIG. 4, four read data copies 60 are shown. The four data copies 60 include a first data copy 62a, a second data copy 62b, a third data copy 62c and a fourth data copy 62d. In the first data copy 62a, the first read data bit corresponds to row 0. In a second data copy 62b, with the ¼ row/address shift, the first read data bit corresponds to row 21. In the third data copy 62c, with the ½ row/address shift, the first read data bit corresponds to row number 42. In the last copy 62d, the first read data bit corresponds to row number 63, which reflects a shift equal to ¾*(84 rows). It can be seen from the figure that the bit ordering in columns 1 through 9 of the first data copy is the result of the initial 8 bit shift. In the data copies 2 through 4, the bit ordering in each column after the first column is the result of the 8 bit shift as well as the additional offset (¼*84 for data copy 2, ½*84 for data copy 3 and ¾*84 for data copy 4).

Thus, the above interleaving process ensures that the data bit copies are not modulated onto adjacent carriers on a given symbol or neighboring symbols. Rather, they are spread uniformly in time and frequency so as to ensure successful decoding. While the redundant data need not be spread uniformly, it will be understood that the greater and more even the data copy spacing, the more robust the transmission is likely to be.

As it may be necessary or desirable to disable certain usable carriers, for example, it may be necessary to disable one or more of the 84 carriers so that the transmission does not interfere with the frequency bands of other RF services, the interleaver shift mechanism is adjustable for different numbers of usable carriers. If the number of usable carriers is 83, for instance, the ¼ offset requires a 20 row shift instead of the 21 row shift used for all 84 carriers and the shift mechanism will be adjusted accordingly.

Preferably, because the robust mode has a lower data rate than the standard transmission mode, its use may be limited to certain communications environments that require a high degree of reliability. For example, the robust mode may be particularly well-suited for use in broadcast transmission modes, in which a sending node cannot adapt to each and every receiving node because each of those nodes has a different channel and those channels may have frequency nulls in different parts of the frequency band. Another use would be to establish initial contact between nodes which communicate over a power line. During such an initial set-up, a sending node does not know which channel connects the sending node to the receiving node and thus will transmit in a mode that the receiver can hear. However, the sender may not want to always transmit in the robust mode, as the robust mode may use too high a percentage of the channel. Thus, the sending node's goal is to migrate to the highest data rate as soon as possible so that other nodes can use the channel. The sending node won't know what that data rate is until it has established initial communications with the receiver.

The encoder 18 fills the interleaver 20 completely before the modulator 22 transmits any data over the transmission channel 16 to the receiver 14.

Returning to FIG. 1, the demodulator 24 demodulates the modulated carriers using a scheme appropriate to the modulation technique used by the modulator 22. The phase angle to metric conversion function 31 of the demodulator 24 produces from a phase angle for each bit of the transmitted carrier data a 3-bit soft decision value from 0 to 7 that represents a probability of a "0" or a "1" bit, with 7 representing a "1" and 0 representing a "0". A phase difference is determined using the following equation:

$$D_{k-mod((2\pi+\theta_k)-\Psi_k, 2\pi)} \quad (2)$$

where $D_k$ is the $k_{th}$ carrier phase difference, $\theta_k$ is the current symbol's $k_{th}$ carrier phase, $\Psi_k$ is the previous symbol's $k_{th}$ carrier phase and $2\pi$ radians is the maximum phase value. The phase difference $D_k$ is converted to a value of 0–127 points ($2\pi$=128). $D_k$ is then offset by an amount, depending on the modulation type, to allow for a single soft decision conversion. Referring to the table shown in FIG. 5, the offset phase difference $P_k$ (for the $k_{th}$ carrier with a value 0–127) is mapped to a 3-bit soft decision value (also referred to as a "bit metric" value).

The de-interleaver 26 (of FIG. 1) receives the 3-bit soft decision value for each data bit. All 3-bit soft decision values are de-interleaved (i.e., stored in the de-interleaver) as a group. The method for writing the interleaver applies to reading the de-interleaver and the method of reading the interleaver applies to writing the de-interleaver. The write operation uses the reverse algorithm of that applied to the interleaver during a read operation.

Figure 6:
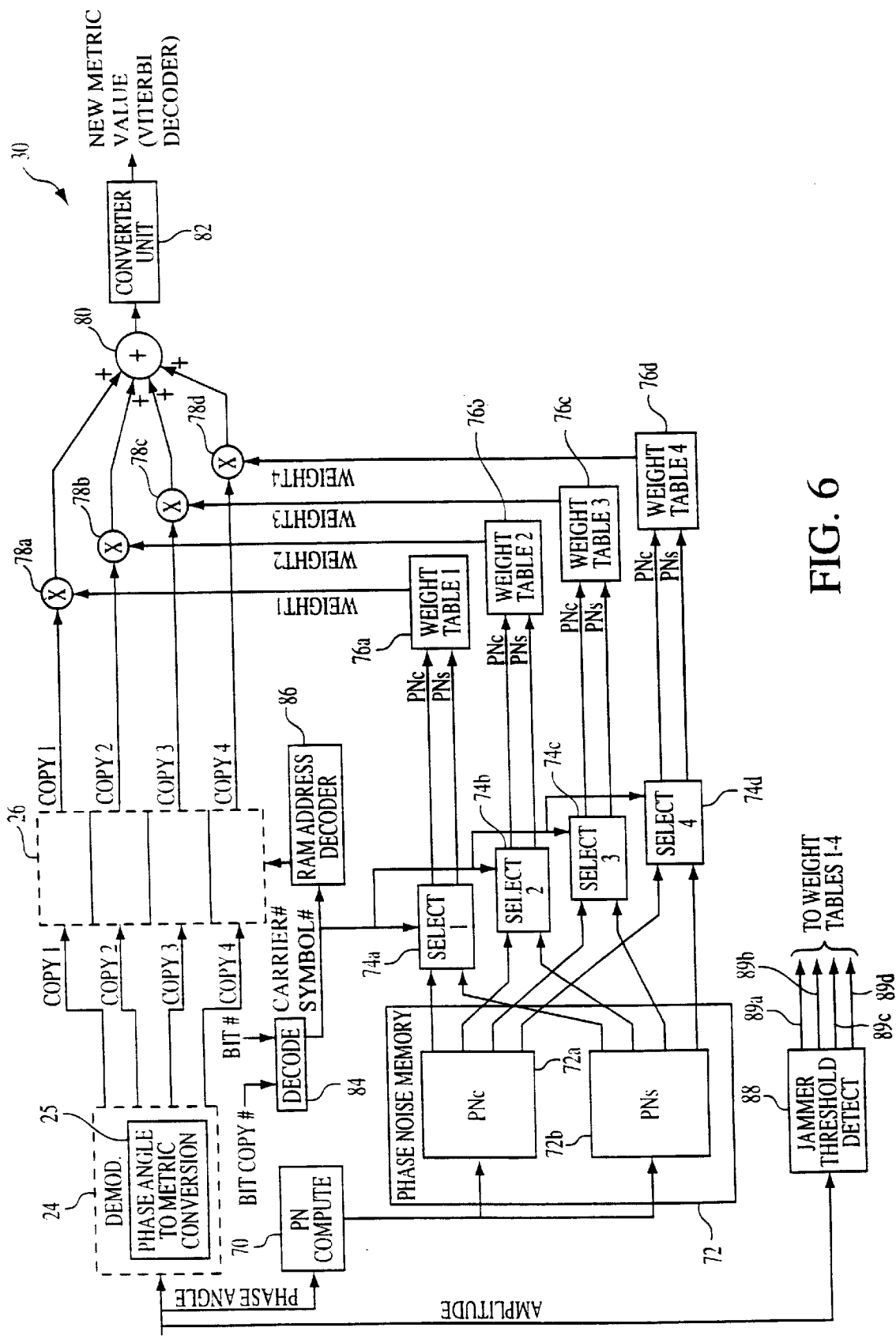
FIG. 6 is a schematic diagram of the controller for controlling the output of the deinterleaver of the receiver shown in FIG. 1.

Referring to FIG. 6, the controller 30 includes a phase noise (PN) computation unit 70, a phase noise memory 72, which includes a carrier phase noise ($PN_c$) memory 72a and a symbol phase noise ($PN_s$) memory 72b, select logic including selectors 1 through 4, corresponding to 74a–74d, respectively, and weight lookup table logic including weight tables 1 through 4, corresponding to 76a–76d. Further included in the controller 30 are multipliers 78a–78d, a summation unit 80 and a conversion unit 82. Also included is decoding logic, including a decode unit 84 and a RAM address decoder 86.

Figure 7:
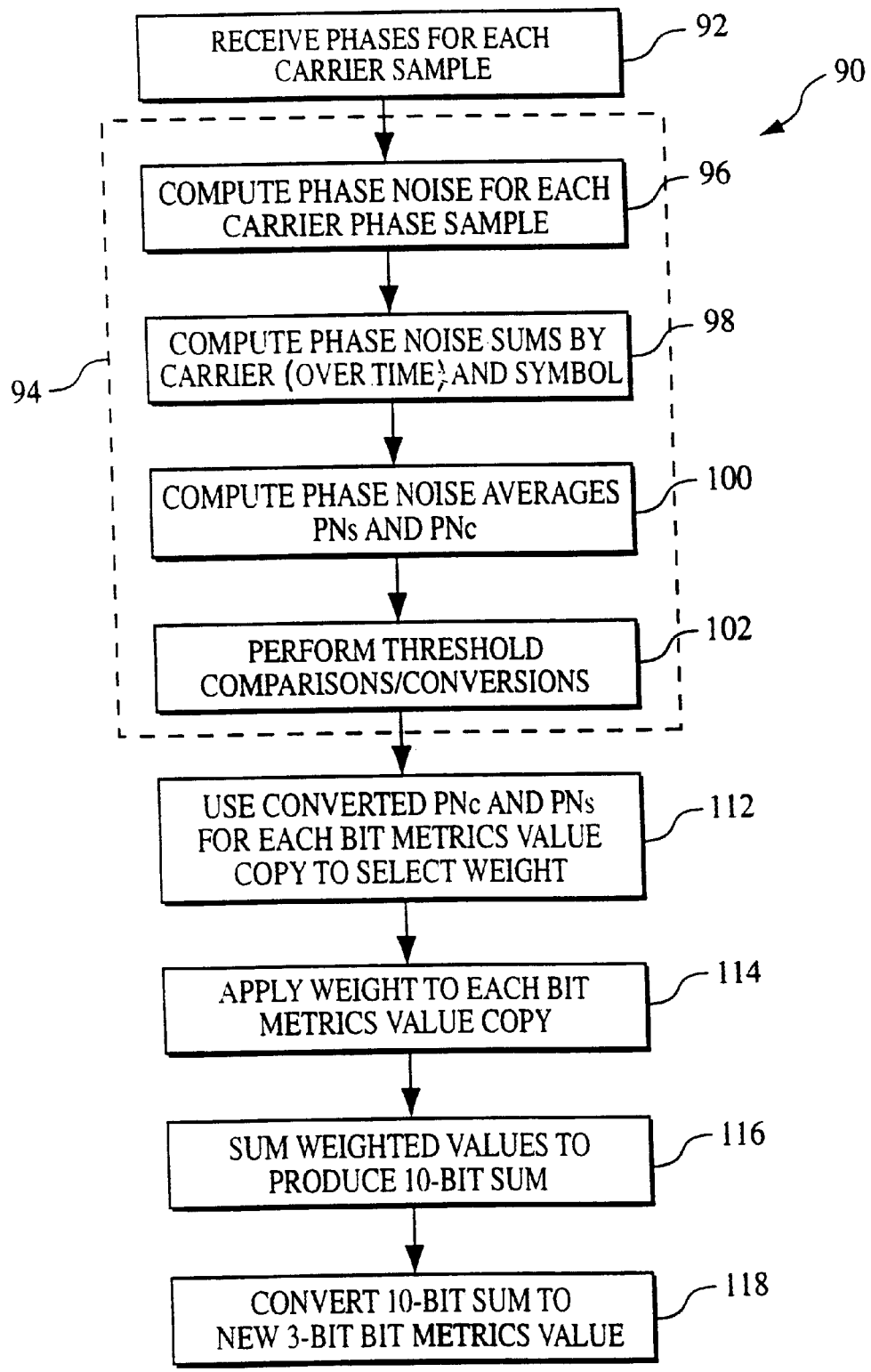
FIG. 7 is a process of de-interleaving and combining the copies produced by the interleaving process of FIG. 3.

The process of combining the metric values for the four transmitted copies into a single metric value is performed by the controller 30 and is illustrated in the flow diagram of FIG. 7. Referring to FIG. 6 and FIG. 7, the phase noise computation unit 70 monitors the phases of each carrier in each OFDM symbol as the OFDM symbol is received from the transmission channel 16 (step 92). The phase noise computation unit 70 computes the phase noise associated with each carrier and each symbol (step 94) by performing i) phase noise estimation (step 96); ii) phase noise estimation accumulation and averaging (steps 98 and 100); and iii) threshold comparison/conversion (step 102). The phase noise estimation of step 96 can be performed for either BPSK or QPSK, that is, whichever modulator type was used by the modulator. For BPSK, a binary 1 causes the transmission of a zero phase and binary 0 the transmission of a $\pi$ phase. As BPSK sends only the two states (corresponding to "1" and "0"), the phase noise computation unit 70 measures how far the samples are from the expected 1 and 0 values.

The phase received from the modulator is first converted to polar to give a corresponding phase angle sample. The constellation plot for the sample may be represented in binary form, with 0 to $2\pi$ radians being represented as 0 to 127 (or 0 to 255) points. For a given sample X, the phase noise computation unit 70 computes a phase noise estimation for the carrier frequency of that sample. It then computes an average of the computed phase noise values for each carrier frequency as well as each symbol. The average may be expressed as $$PN_{avg}=(\Sigma Y1)/(\text{total number of samples}) \quad (3)$$

where $Y1=|Y-(\pi/2)|$ and $Y=mod[X+(\pi/2);\pi]$. The value Y1 is the phase noise and is expressed in terms of number of points from the ideal expected modulation values, which in the case of BPSK are zero or $\pi$, the zero or $\pi$ states being indicative of no noise.

The phase angle is represented in binary form as a phase number between 0 and 127 (or 0 and 255). The phase noise computation unit 70 creates a modulus of a phase number y, e.g. 64 (or 32), adds y/2 points, and finds X+(y/2) mod y. It then subtracts y/2 so that the result is always a value between −y/2 and +y/2. Once the phase noise computation unit 70 obtains the absolute value of that value, the result lies in the first quadrant (0 to y/2) of the constellation.

Figure 8A:
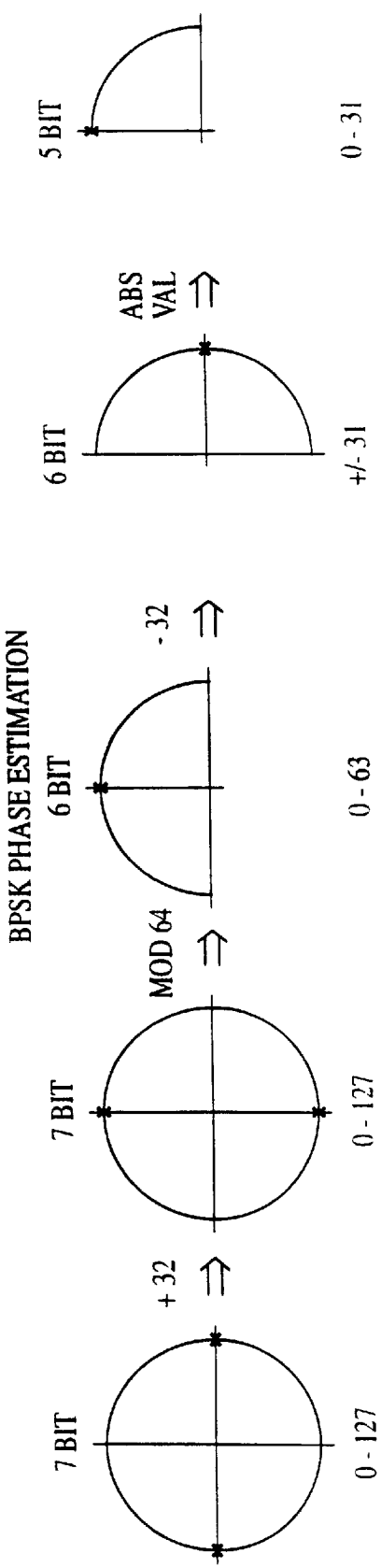
FIG. 8A and FIG. 8B are illustrations of BPSK phase noise and QPSK phase noise computations, respectively, performed by the controller of FIG. 6.

An exemplary phase noise calculation for BPSK is illustrated in FIG. 8A. In the constellation plot of the example shown, $2\pi$ radians is represented as a binary value corresponding to 128 points. For a sample having a phase number of 80, the calculation adds 32 to give a sum of 112 and computes (112 mod 64). Thus, referring to Eq. (3), Y equals 48 and Y1 is equal to the absolute value of ( 48–32), or 16 points.

Figure 8B:
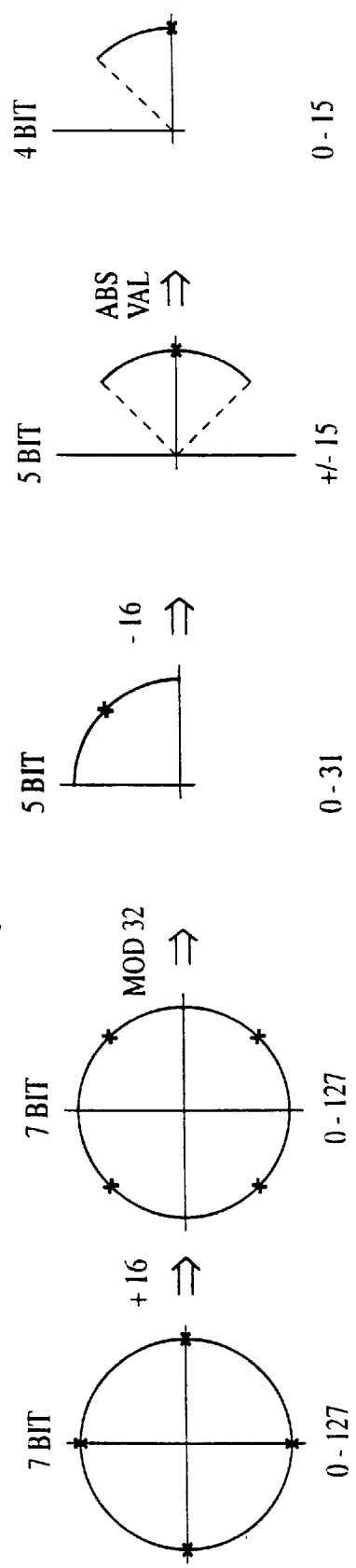

A similar phase noise computation may be performed for QPSK, which uses four states (or phases) spaced $\pi/2$ apart. An exemplary QPSK phase noise estimation is illustrated in FIG. 8B.

The phase noise average of Eq. (3) and step 100 (of FIG. 7) may be computed for phase noise as a function of the carrier, the symbol, or both. To compute the carrier phase noise average, $PN_c$, the phase noise computation unit 70 accumulates carrier values for a given carrier for all of the symbols and divides by the total number of symbols. In the described embodiment, the total number of symbols in an OFDM packet is 40. Thus, $PN_c$, is the average phase noise for a carrier for the entire block of data associated with the bit metrics stored in the deinterleaver. Additionally, for a symbol phase noise average, $PN_S$, the phase noise across all carriers in a symbol is accumulated and divided by total number of carriers (i.e., 84). The $PN_s$. value provides an indication of how carrier phase noise varies (relative to $PN_c$) from symbol to symbol. Thus, the combination provides a reasonable estimate of signal-to-noise (S/N) for a given carrier on a symbol-by-symbol basis.

Figure 9:
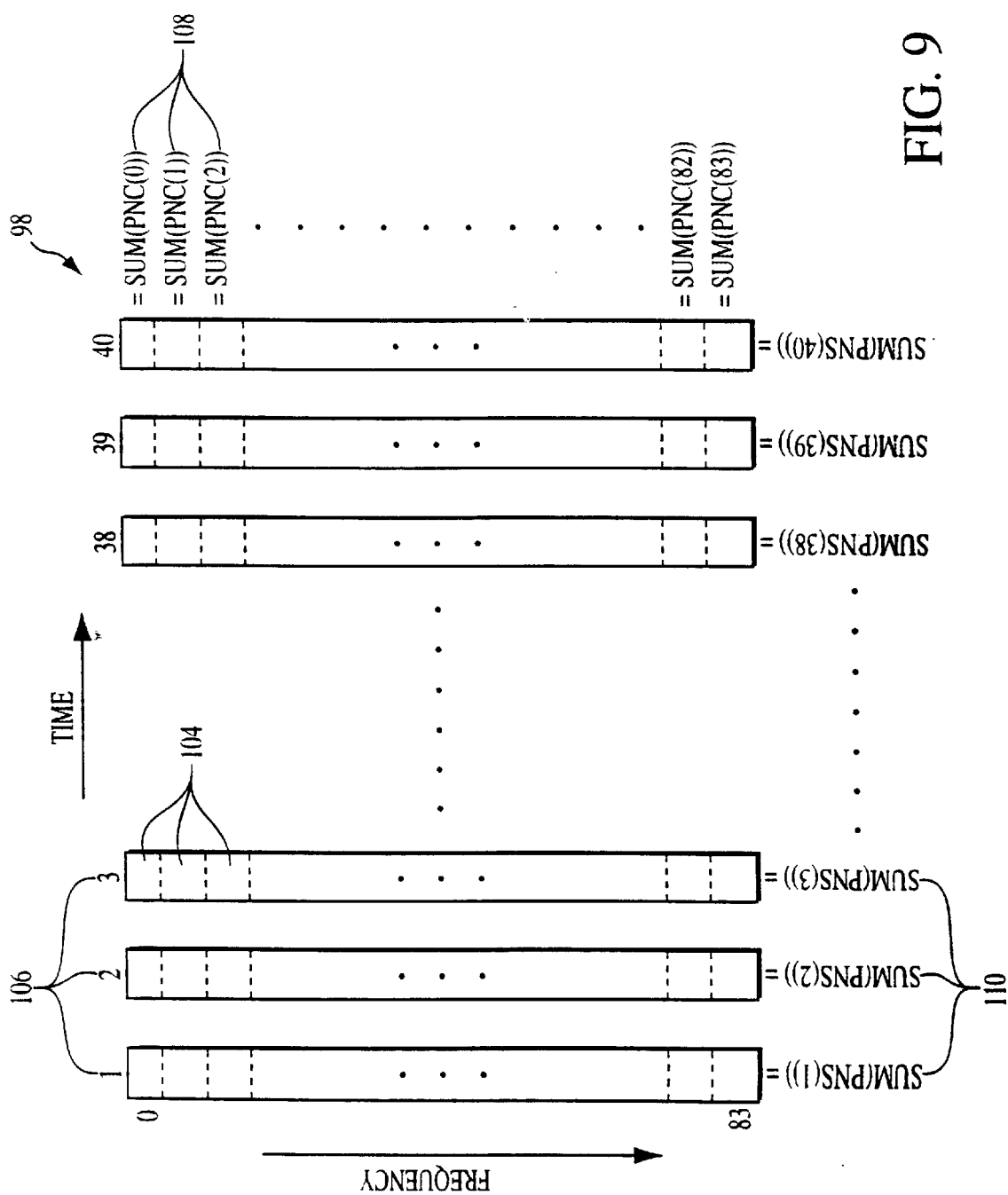
FIG. 9 is an illustration of the accumulation portion of phase noise averaging performed across both carriers and symbols shown in FIG. 7.

Referring to FIG. 9, the accumulation (or summation) of phase noise values for a given carrier frequency over time and by symbol (step 98 of FIG. 7) is depicted. The phase noise values for each carrier 104 are accumulated by summing the phase noise values for each carrier over the forty OFDM symbols 106 to give a sum, SUM(PNC(M)) 108, where M is one of carriers 0 to 83. Similarly, the phase noise values are accumulated for each OFDM symbol 106 by summing the phase noise values for all 84 carriers 104 to give a sum, SUM(PNS(N)) 110, where N is one of symbols 1 through 40. The total number of symbol accumulations or sums is therefore 40. Any carriers not used by the transmission are excluded from the summation.

The computed phase noise averages ($PN_c$ and $PN_s$ values) are stored in the respective memories 72a and 72b (of FIG. 6). Returning to FIG. 7, once the phase noise averages have been computed (at step 100), the phase noise computation unit 70 performs the phase noise average threshold comparison/conversion (step 102). That is, each carrier phase noise average $PN_c$ is compared to two thresholds, "$C_1$" and "$C_2$" to convert the $PN_c$ to one of 3 (2-bit) states or values: 0, 1 or 2. Each state indicates a different threshold level of sample quality. The zero value corresponds to "poor", the one value to "medium", and the two value to "good". Likewise, each $PN_s$ is compared to two thresholds "$S_1$" and "$S_2$" to convert the $PN_s$ to one of the same three values. Together, the 2-bit values for $PN_s$ and $PN_c$ form a 4-bit select value which, under the control of the decode unit 84, is provided by an appropriate selector of selectors 74a–d to a corresponding one of the weight tables 76a–d to select a weight value for the bit metric value (associated with one of the data bit copies) stored in the deinterleaver (step 112).

The decode unit 84 derives a carrier number and a symbol number for each bit number and bit copy number. The decode unit 84 provides as a select to each of the selectors 74a–74d the carrier number and the symbol number for the bit copy to which the selector corresponds. For example, if bit copy 1 was transmitted on carrier 1 of symbol 1, then providing bit 1 and carrier 1 to the first selector 74a serves to select the two-bit values for $PN_c$ for carrier 1 and $PN_s$ for symbol 1 as inputs to the first weight table 76a. Similarly, if bit copy 2 was transmitted on carrier 21 of symbol 11, then providing bit 2 and carrier 21 to the second selector 74b operates to select the two-bit values for the $PN_c$ for carrier 21 and the $PN_s$ for symbol 11 as inputs to the second weight table 76b. Selections are made in a similar fashion for bit copies 3 and 4 via their corresponding selectors 74c and 74d.

The carrier and symbol numbers provided by the decode unit 84 are also used by the RAM address decoder 86 in retrieving the appropriate bit metric values from the deinterleaver 26.

The weight selection is further described with reference to the weight lookup table of FIG. 10 and Table 1 below. Referring to FIG. 10 and Table 1, the four bit select value is of the form: $S_2$(bit 3), $S_1$ (bit 2), $C_2$ (bit 1) and $C_1$ (bit 0). The mapping of the select values, along their logical representations, to corresponding weights is as follows:

TABLE 1

| Select | Logic Expression | Weight |
| --- | --- | --- |
| 1X1X | $S_2C_2$ | 1 |
| 1X01 | $S_2C_2{,}_{C1}$ | ¾ |
| 1X00 | $S_2C_2{,}_{C1}'$ | ½ |
| 011X | $S_2'S_1C_2$ | ¾ |
| 0101 | $S_2'S_1C2'C_1$ | ½ |
| 0100 | $S_2'S_1C2'C_1'$ | ¼ |
| 001X | $S_2'S_1'C_2$ | ½ |
| 0001 | $S_2'S_1'C_2'C_1$ | ¼ |
| 0000 | $S_2'S_1'C_2'C_1'$ | ⅛ |

The weight table shown in FIG. 10 is implemented in a is 5:1 multiplexer, with each of the 5 weight values as inputs and the selected weight (selected by the select value) as output.

Each metric value copy read from the deinterleaver for each of the four copies is multiplied by the corresponding weight value (provided by the corresponding one of weight tables 76a–76d) by a corresponding one of the multipliers 78a–78d (step 114). The four weighted metric values are summed together by the summation unit 80 to produce a combined (or single) 10-bit metric value (step 116), which the conversion unit 82 converts to a "new" 3-bit metric value (step 118). The "new" metric value is then processed by the decoder 28.

Thus, the above technique uses the phase noise computation to weight metric copies differently. The copy samples with less phase noise are weighted more heavily than the copy samples with more phase noise.

The complete transformation of the initial 3-bit values produced by the demodulator to the new 3-bit value as performed by the controller 30 is depicted in FIG. 11. First, although not shown in FIG. 6, the 3-bit bit metric values are converted to 5-bit values as they are read out of the de-interleaver. Next, the appropriate weighting is applied to the 5-bit value to produce an 8-bit weighted value. The four weighted values are summed together. The 10-bit sum is truncated and floored to give a 6-bit value. A +4 value is added to the 6-bit value, which is then limited or saturated down to a 3-bit value ranging from 0 to 7. The bit metric value is once again in a form which can be utilized by the Viterbi decoder.

Preferably, the controller 30 as described thus far may be modified to include a jammer threshold detect unit 88, which receives the amplitudes of the transmitted carrier samples of the four copies and can produce a separate override signal for each of the four copies (shown, collectively, as output signals 89a through 89d, which correspond to copies 1–4, respectively) if the amplitude of that carrier sample copy exceeds a minimum jammer detection threshold level. If the minimum jammer detection threshold level is exceeded, the override signal overrides the weight selected by the above-described $PN_c/PN_s$ select by forcing the output of the corresponding weight table for the copy to the minimum weight ("⅛").

Figure 12:
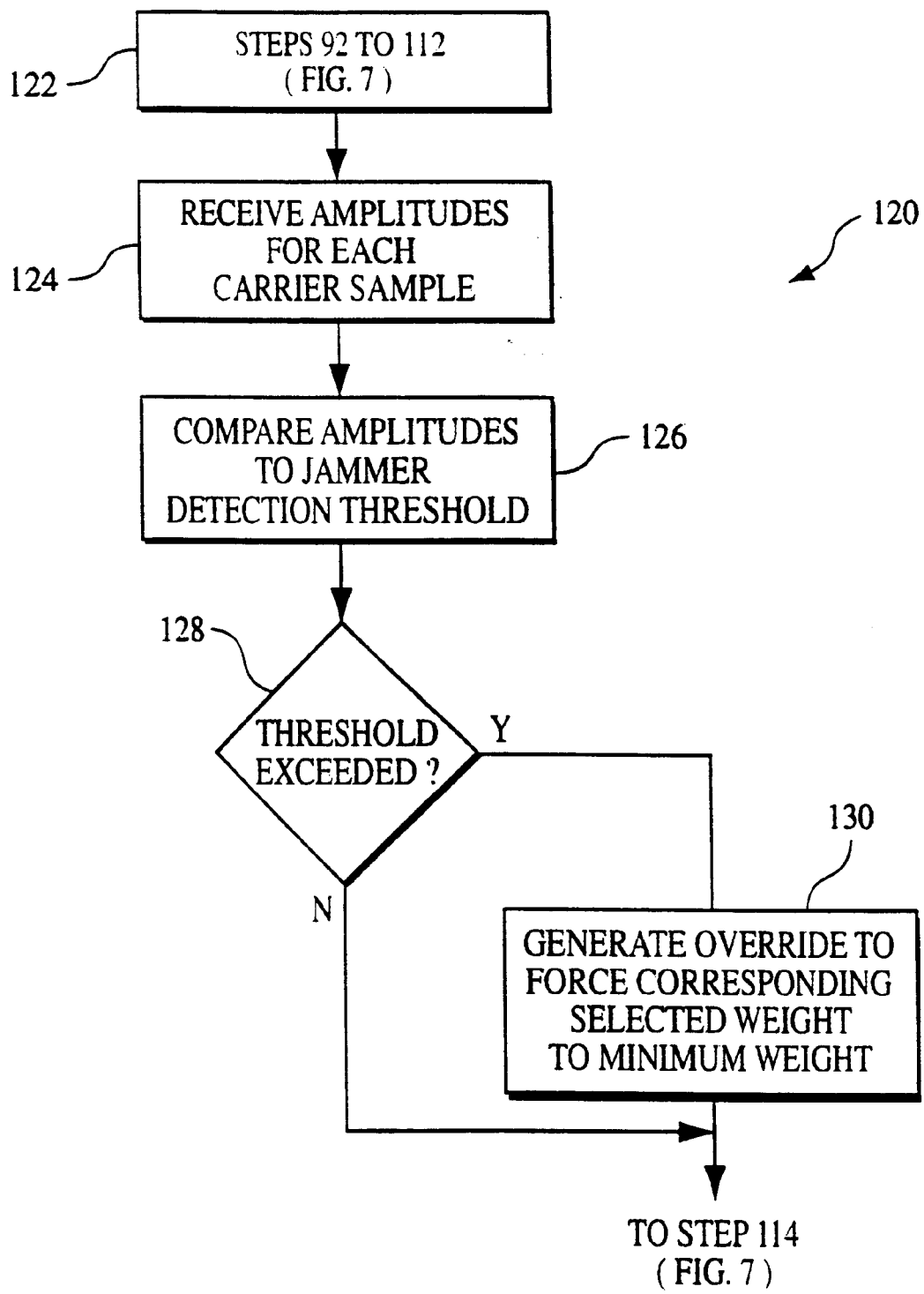
FIG. 12 is the combining process (of FIG. 7) modified for jammer threshold detection.

A copy combine process (i.e., process of combining the metric values for the four transmitted copies into a single metric value) with jammer threshold detect 120 is shown in the flow diagram of FIG. 12. Referring to that figure, the controller 30 performs steps 92 through 112 from FIG. 7 (step 122). The controller 30 also receives amplitudes of each carrier sample (step 124) and compares those amplitudes to a predetermined jammer detection threshold (step 126). If the predetermined jammer detection threshold is exceeded, the controller 30 generates an override signal for the copy to which the carrier sample corresponds to force the weight selected at step 112 (FIG. 7) to the minimum weight (step 130). If the threshold is not exceeded, the controller proceeds to step 114 from FIG. 7. That is, it provides the weight selected by $PN_c/PN_s$ (at step 112 of FIG. 7) for each copy to the corresponding metric value copy as discussed above. If will be appreciated that the controller may perform steps 124 through 130 in parallel with the phase noise computations and related weight selections, as long as the override signal (if generated) is available to control the output of the corresponding weight table at the appropriate time.

OTHER EMBODIMENTS

It is to be understood that while the invention has been described in conjunction with the detailed description thereof, the foregoing description is intended to illustrate and not limit the scope of the invention, which is defined by the scope of the appended claims. Other embodiments are within the scope of the following claims.

For example, the phase noise computation unit 70 could simply include a combining unit for summing the four values and using the sum to compute an average (i.e., straight, as opposed to weighted, averaging), or a selector (e.g., MUX) for selecting the best carrier from among the four values (copies).

In yet another alternative, the phase noise computation unit 70 could use the $PN_c$ and $PN_s$ values to estimate S/N for symbols and carriers, and use lookup tables based on the S/N estimates to arrive at new bit metric values which take into account how good or bad a particular carrier or symbol is.

In yet another alternative, the demodulator 24 could store phase angle representations for each of the copies in the deinterleaver instead of converting the copies to metric values and storing the metric value copies in the deinterleaver as described above. In this embodiment, the phase angle-to-bit metric value conversion function (corresponding to the phase angle to metric value converter 31 of FIG. 1) would be performed at the output of the summation unit 80 (FIG. 6). That is, the phase angle to metric converter could be coupled to the summation unit 80 and conversion unit 82 so as to receive the combined weighted phase angle representation from the output of the summer 80, and provide a metric value for that output to the input of the conversion unit 82. Alternatively, the phase angle-to-metric conversion could be included in the converter unit 82. Quite possibly, the system could be implemented to include two separate converters—one in the demodulator and one at the output of the summation unit 80—if also provided with suitable select/control logic, in order to support either deinterleaved metric value copies or phase angle representation value copies.

What is claimed is:

1. A method of interleaving encoded data to be modulated onto carriers in a packet of OFDM symbols comprising:
   interleaving the encoded data to produce multiple copies of the encoded data which are spread in the time on non-consecutive OFDM symbols in the packet of OFDM symbols and in frequency on non-adjacent carriers of the carriers in the packet of OFDM symbols.

2. The method of claim 1, wherein interleaving comprises:
   storing the encoded data in an interleaver memory by row; and
   reading the encoded data from the interleaver memory by column, the encoded data stored in the interleaver memory being read n consecutive times.

3. The method of claim 2, wherein reading comprises:
   providing an offset to all but the first of the column reads of each of the n consecutive reads and providing different additional offsets to all but the first of the n consecutive reads.

4. The method of claim 3, wherein n is equal to 4.

5. A method of processing OFDM data transmitted over a transmission channel comprising:
   receiving multiple copies of the OFDM data from the transmission channel, the multiple copies being spread in time and frequency; and
   combining phase angle information for the multiple copies to produce a single metric value for use in decoding the OFDM data.

6. The method of claim 5, wherein the phase angle information is a metric value and combining comprises:
   converting phase angles of the multiple copies to metric values;
   computing phase noise values from the phase angles for the data copies;
   selecting a weighting based on the computed phase noise values and applying the selected weighting to the metric values; and
   summing the weighted metric values.

7. The method of claim 5, wherein combining comprises:
   summing the metric values to produce a sum and using the sum to compute an average metric value as a single new metric value.

8. The method of claim 5, wherein combining comprises:
   selecting one of the metric values.

9. The method of claim 5, wherein the phase angle information is a phase angle representation and wherein combining comprises:
   computing phase noise values from the phase angles for the data copies;
   selecting a weighting based on the computed phase noise values and applying the selected weighting to the phase angle representations;
   summing the weighted phase angle representations; and
   converting the weight phase angle representations to a single metric value.

10. The method of claim 6, further comprising:
    comparing amplitudes of the multiple copies to a jammer detection threshold and generating a signal to force the selected weighting to a minimum weighting.

11. The method of claim 9, further comprising:
    comparing amplitudes of the multiple copies to a jammer detection threshold and generating a signal to force the selected weighting to a minimum weighting.

12. An apparatus for interleaving encoded data to be modulated onto carriers in a packet of consecutive OFDM symbols comprising:

an encoder for storing the encoded data in an interleaver; and a modulator for reading multiple copies of the encoded data from the interleaver so that the encoded data copies are spread in time on non-consecutive OFDM symbols in the packet of consecutive OFDM symbols and in frequency on non-adjacent carriers of the carriers in the packet of consecutive OFDM symbols.

13. An apparatus for processing OFDM data transmitted over a transmission channel comprising:

a demodulator for receiving multiple copies of the OFDM data from the transmission channel, the multiple copies being spread in time and frequency; and a controller for combining phase angle information for the multiple copies to produce a single metric value to be used in decoding the OFDM data.

14. The apparatus of claim 13, wherein the controller comprises:

a phase noise computation unit for computing phase noise values from the phase angles for the data copies;

circuitry for selecting a weighting based on the computed phase noise values and applying the selected weighting to the phase angle information; and a summation unit for summing the weighted phase angle information.

15. The apparatus of claim 13, wherein the phase angle information comprises metric values produced by the demodulator from phase angles of the multiple copies.

16. The apparatus of claim 13, wherein the phase angle information comprises phase angle representations and wherein the controller further comprises:

a phase angle to metric converter for converting the the summed weighted phase angle information to a single metric value.

17. The apparatus of claim 13, wherein the controller comprises:

a combining unit for summing the metric values to produce a sum and using the sum to compute an average metric value as a single new metric value.

18. The apparatus of claim 13, wherein the controller comprises:

a selector for selecting one of the metric values.

19. The apparatus of claim 14, wherein the controller further comprises:

a jammer threshold detection unit for comparing amplitudes of the multiple copies to a jammer detection threshold level and generating a signal to force the selected weight to a minimum weight.

* * * * *

UNITED STATES PATENT AND TRADEMARK OFFICE
CERTIFICATE OF CORRECTION

PATENT NO. : 6,278,685 B1
DATED : August 21, 2001
INVENTOR(S) : Lawrence W. Yonge III, Bart W. Blanchard, and Harper Brent Mashburn It is certified that error appears in the above-identified patent and that said Letters Patent is hereby corrected as shown below:

Column 3,
Line 55, "$2\pi-A_{R-(\pi/2)}$" should be -- $2\pi-A_R-(\pi/2)$ --.

Column 4,
Line 59, "62 a" should be -- $62a$ --.

Column 5,
Equation (2), "$D_{k=mod((2\pi+\theta_k)-\Psi_k,2\pi)}$" should be -- $D_k=mod((2\pi+\theta_k)-\Psi_k,2\pi)$ --.

Column 7,
Line 22, after "$PN_s$", delete the period.
Line 66, "$PN_c$" should be -- $PN_s$ --.

Column 8,
TABLE 1, line 2, "$S_2C_{2,C1}$" should be -- $S_2C_2,C_1$ --.
TABLE 1, line 3, "$S_2C_{2,C1}$" should be -- $S_2C_2,C_1$ --.
TABLE 1, line 5, "$S_2'S_1,C2'C_1$" should be -- $S_2'S_1,C_2'C_1$ --.
TABLE 1, line 6, "$S_2'S_1,C2'C_1'$" should be -- $S_2'S_1,C_2'C_1$ --.
TABLE 1, line 7, "i/2" should be -- 1/2 --.

Column 10,
Line 7, after "in", delete "the".

Column 12,
Line 9, delete the second occurrence of "the".

Signed and Sealed this

Twenty-sixth Day of March, 2002

*Attest:*

*Attesting Officer*

JAMES E. ROGAN
*Director of the United States Patent and Trademark Office*